US 8,294,156 B2

(12) United States Patent
Jang et al.

(10) Patent No.: US 8,294,156 B2
(45) Date of Patent: Oct. 23, 2012

(54) NANOCRYSTAL LIGHT-EMITTING DIODE

(75) Inventors: Eun Joo Jang, Suwon-si (KR); Jung Eun Lim, Yongin-si (KR); Hyo Sook Jang, Seongnam-si (KR); Eun Hwa Lee, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 98 days.

(21) Appl. No.: 12/171,038

(22) Filed: Jul. 10, 2008

(65) Prior Publication Data
US 2009/0127576 A1    May 21, 2009

(30) Foreign Application Priority Data

Nov. 19, 2007 (KR) .......................... 10-2007-0117933
Apr. 16, 2008 (KR) .......................... 10-2008-0035284

(51) Int. Cl.
*H01L 33/48* (2010.01)
(52) U.S. Cl. ..................................... 257/69; 257/E33.07
(58) Field of Classification Search ............. 257/E33.07, 257/E33.069, 98
See application file for complete search history.

(56) References Cited

U.S. PATENT DOCUMENTS

| | | | |
|---|---|---|---|
| 5,847,507 A * | 12/1998 | Butterworth et al. | 313/512 |
| 2002/0190266 A1 * | 12/2002 | Kanatake | 257/112 |
| 2004/0105481 A1 * | 6/2004 | Ishida et al. | 372/108 |
| 2004/0124487 A1 * | 7/2004 | Loh | 257/433 |
| 2004/0190304 A1 * | 9/2004 | Sugimoto et al. | 362/555 |
| 2005/0215164 A1 * | 9/2005 | Mueller et al. | 445/24 |
| 2006/0113895 A1 * | 6/2006 | Baroky et al. | 313/501 |
| 2006/0289884 A1 | 12/2006 | Soules et al. | |
| 2007/0012941 A1 | 1/2007 | Cheon | |
| 2008/0173886 A1 * | 7/2008 | Cheon et al. | 257/98 |

FOREIGN PATENT DOCUMENTS

| JP | 63208115 A  *  | 8/1988 |
|---|---|---|
| JP | 07-049019 | 2/1995 |
| KR | 1020060087985 A | 8/2006 |

OTHER PUBLICATIONS

Walker et al; "Quantum-dot optical temperature probes" Applied Physics Letters, vol. 83, No. 17, Oct. 2003, pp. 3555-3557.

* cited by examiner

*Primary Examiner* — Lex Malsawma
*Assistant Examiner* — Allen Parker
(74) *Attorney, Agent, or Firm* — Cantor Colburn LLP

(57) ABSTRACT

A nanocrystal light-emitting diode with improved structural stability is disclosed. Specifically, the nanocrystal light-emitting diode comprises an excitation source, a nanocrystal-containing light conversion layer and an air layer formed therebetween to be exposed to the outside.

21 Claims, 2 Drawing Sheets

NANOCRYSTAL LIGHT-EMITTING DIODE

This application claims priority to Korean Patent Application Nos. 10-2007-117933, filed on Nov. 19, 2007, and 10-2008-0035284, filed on Apr. 16, 2008, and all the benefits accruing therefrom under U.S.C. §119, the contents of which in their entirety are herein incorporated by reference.

BACKGROUND OF THE INVENTION

1. Field of the Invention

This disclosure is directed to a nanocrystal light-emitting diode with improved structural stability. Exemplary embodiments of the present invention relate to a nanocrystal light-emitting diode with improved stability which comprises an excitation source, a nanocrystal-containing light conversion layer and an air layer formed therebetween to be exposed to the outside.

2. Description of the Related Art

In recent years, light-emitting diodes ("LEDs") covering the entire visible spectrum, including red, green and blue, have been developed, and their applications have been extended to light sources for lighting systems and displays. Particularly, a white light-emitting diode is known to have a structure in which red, green and blue light-emitting diodes are simultaneously driven or a light-converting material is employed to convert the emission wavelengths of a light-emitting diode as an excitation source to different wavelengths. In the most generally available structures employing light-converting materials, a YAG phosphor emitting yellow light in a broad spectral range is applied to a blue LED chip, or a mixture of red and green phosphors is applied to achieve improved color purity. However, white light-emitting diodes employing inorganic phosphors developed hitherto have difficulty attaining satisfactory performance characteristics in terms of efficiency and color purity, compared to white light-emitting diodes in which red, green and blue light-emitting diodes are simultaneously driven to achieve white light emission. To overcome these limitations, semiconductor nanocrystals, which are known as materials with high luminescence efficiency and good color purity, have recently attracted much attention as novel light-converting materials for light-emitting diodes. Semiconductor nanocrystals absorb light over a broad spectral range and emit light of wavelengths corresponding to specific band gaps. Based on these advantages, the use of semiconductor nanocrystals enables the fabrication of white light-emitting diodes having emission wavelengths which can be controlled without being greatly affected by the wavelengths of particular excitation sources and having superior color purity to achieve high color reproducibility. Nonetheless, current studies on the application of semiconductor nanocrystals to light-emitting diodes still remain at the early stages and the precise mechanisms of many phenomena of the semiconductor nanocrystals is not established. In addition, semiconductor nanocrystals are smaller in size and are more susceptible to surface defects than inorganic phosphors. Because of these disadvantages, the luminescence efficiency and the emission wavelengths of nanocrystals may be negatively affected by heat generated upon driving the light-emitting diodes. A typical nanocrystal-containing light conversion layer is formed by applying nanocrystal/polymer resin composites to a light-emitting diode chip. However, the organic polymer constituting the light conversion layer is likely to be decomposed by heat generated upon driving or photons intensively emitted from the light source. The decomposition of the organic polymer will involve serious damage to the life and stability of the light-emitting diode.

BRIEF SUMMARY OF THE INVENTION

Accordingly, exemplary embodiments of the present invention have been made to develop a nanocrystal light-emitting diode with improved structural stability.

In an exemplary embodiment, a nanocrystal light-emitting diode includes: an excitation source; a nanocrystal-containing light conversion layer; and an air layer formed therebetween to be exposed to the outside.

BRIEF DESCRIPTION OF THE DRAWINGS

Exemplary embodiments of the present invention will be more clearly understood from the following detailed description taken in conjunction with the accompanying drawings.

FIGS. 1 and 2 are schematic cross-sectional views of light-emitting diodes according to exemplary embodiments of the present invention;

FIG. 3 is a partially cut-away perspective view of a light-emitting diode according to an exemplary embodiment of the present invention; and FIG. 4 is an emission spectrum of a light-emitting diode fabricated in Example 1.

DETAILED DESCRIPTION OF THE INVENTION

Figure 1:
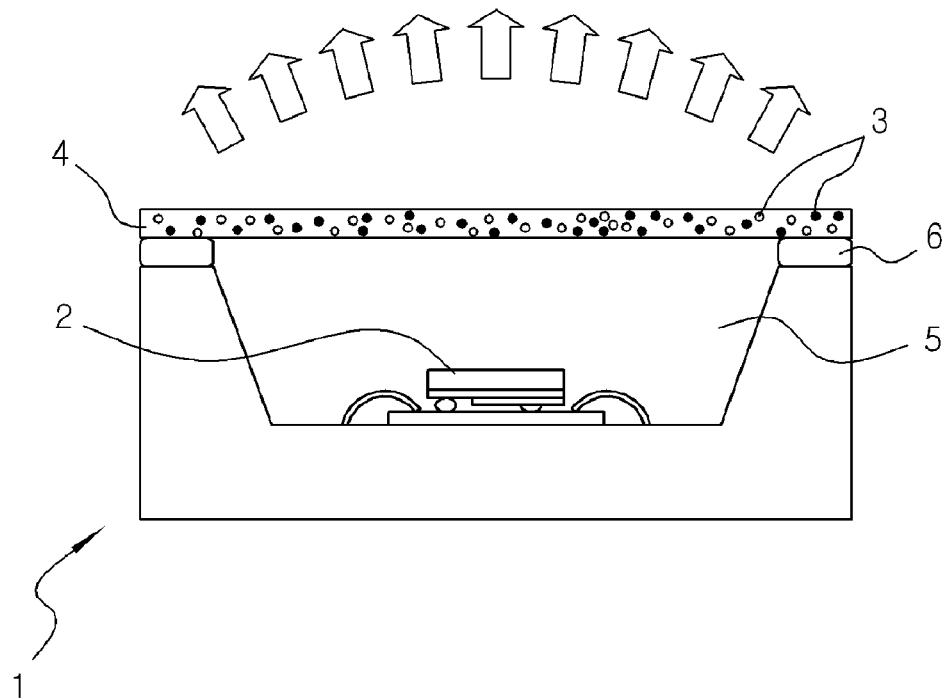
FIGS. 1 to 4 represent non-limiting, exemplary embodiments of the present invention as described herein.

Hereinafter, exemplary embodiments will be described in more detail with reference to the attached drawings.

It should be noted that the Figures are intended to illustrate the general characteristics of methods, structure and/or materials utilized in certain exemplary embodiments and to supplement the written detailed description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity.

Reference now should be made to the drawings, in which the same reference numerals are used throughout the different drawings to designate the same or similar components. In the drawings, the thicknesses and widths of layers are exaggerated for clarity. Exemplary embodiments may, however, be embodied in many different forms and should not be construed as limited to the exemplary embodiments set forth herein. Rather, these exemplary embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements of the device described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations which are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes which result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments of the present invention belong. It will be further understood that terms, such as those defined in commonly used dictionaries, should be interpreted as having a meaning which is consistent with their meaning in the context of the relevant art and will not be interpreted in an idealized or overly formal sense unless expressly so defined herein.

Exemplary embodiments of the present invention provide a nanocrystal light-emitting diode which includes an excitation source, a nanocrystal-containing light conversion layer and an air layer formed therebetween to be exposed to the outside.

Figure 2:
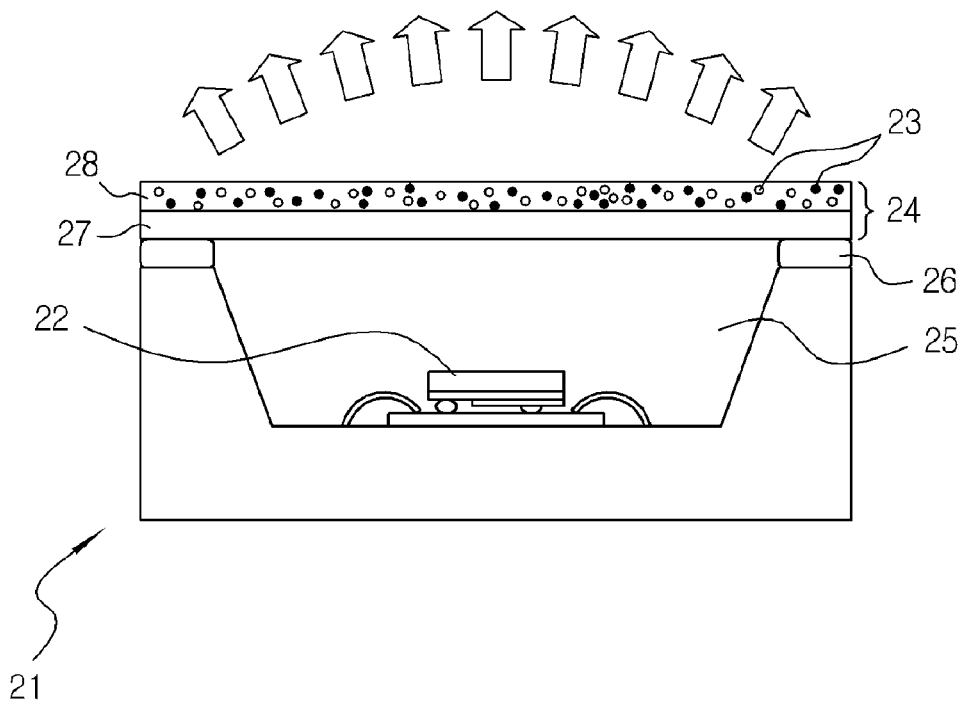
Figure 3:
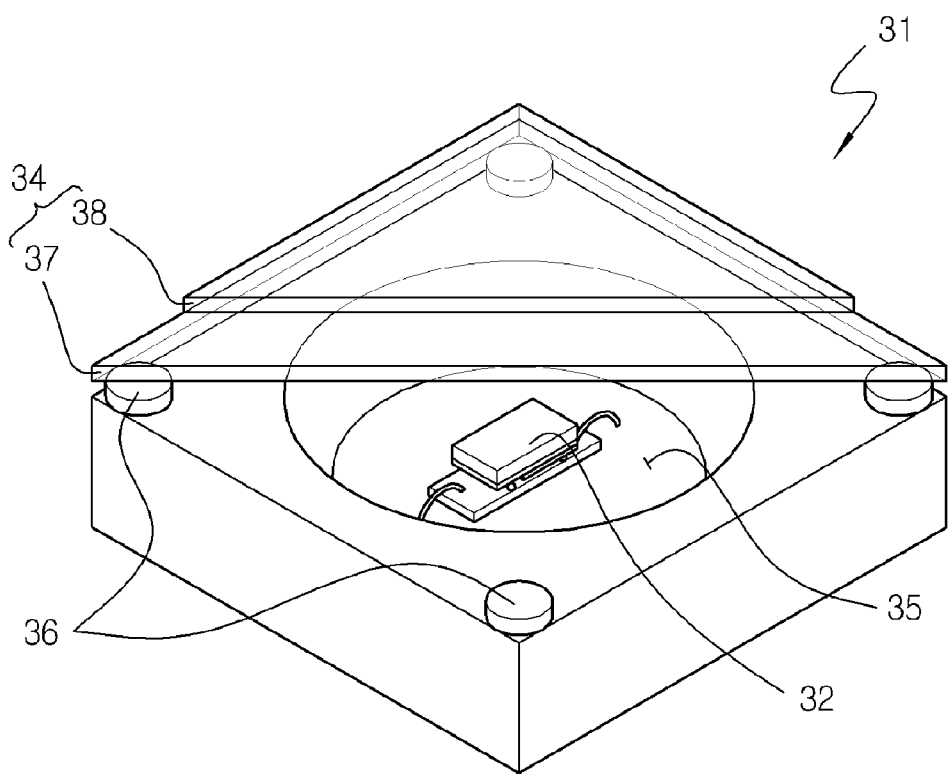

FIGS. 1 and 2 are schematic cross-sectional views of light-emitting diodes according to exemplary embodiments, and FIG. 3 is a partially cut-away perspective view of a light-emitting diode according to an exemplary embodiment.

Referring to FIGS. 1 and 2, a light-emitting diode 1 or 21 comprises an excitation source 2 or 22, a light conversion layer 4 or 24 containing nanocrystals 3 or 23, and an air layer 5 or 25 formed therebetween, wherein the air layer 5 or 25 is exposed to the outside to allow air to freely flow therethrough.

As shown in FIG. 3, an air layer 35 is formed between an excitation source 32 and a light conversion layer 34 to be exposed to the outside so that air can freely flow therethrough. This configuration prevents direct transfer of heat generated from the excitation source 32 to the light conversion layer 34 and prevents continuous increase in the temperature of the air layer 35 due to the circulation of air. As a result, degradation of nanocrystal/polymer composites constituting the light conversion layer 34 is avoided, which contributes to an improvement in the stability of the nanocrystal light-emitting diode 31. Light emitted from the excitation source 32 can be scattered to the light conversion layer 34 to permit the light conversion layer 34, where the light sources (e.g., nanocrystals) with lower intensity are distributed over a broad area, to emit light. That is, the nanocrystal light-emitting diode 31 enables more efficient utilization of the light-converting materials.

In the light-emitting diode of exemplary embodiments of the present invention disclosed in FIGS. 1-3, the light conversion layer 4, 24, 34 may be disposed above the excitation source 2, 22, 32.

The light-emitting diode of the exemplary embodiments disclosed in FIGS. 1-3 may further comprise supports 6, 26, 36 under the light conversion layer 4, 24, 34 to maintain a gap between the excitation source 2, 22, 32 and the light conversion layer 4, 24, 34. The gap between the excitation source 2, 22, 32 and the light conversion 4, 24, 34 can be varied depending on the height of the supports 6, 26, 36. The supports 6, 26, 36 serve to fix the light conversion layer 4, 24, 34 on a structure (e.g., an LED package) including the excitation source 2, 22, 32. Any suitable method may be used to fix the light conversion layer 4, 24, 34 over the excitation source 2, 22, 32. For example, a curable material (e.g., an epoxy resin) is applied to portions of a structure including the excitation source 2, 22, 32, covered with the light conversion layer 4, 24, 34, and cured to fix the light conversion layer 4, 24, 34 on the structure.

In exemplary embodiments the gap is adjusted to 0.05 mm or more. As the gap between the excitation source and the light conversion layer increase, the influence of heat generated from the excitation source becomes less significant and the absorption of light emitted from the excitation source is possible in a broader region.

The excitation source of the light-emitting diode according to exemplary embodiments of the present invention may be a light-emitting diode ("LED") as a light source. The emission wavelengths of the excitation source are not particularly limited. In exemplary embodiments, the excitation source emits UV light and blue light in a wavelength range of 340 nanometers (nm) to 480 nm, which have a sufficient high energy to excite the light-emitting materials (e.g., nanocrystals).

The structure of the light-emitting diode according to exemplary embodiments may be modified. For example, a material having a refractive index between the refractive indices of the excitation source and air may be applied to the excitation source to cover the excitation source.

Examples of suitable semiconductor nanocrystals for use in the light conversion layer 4, 24, 34 include Group II-VI compounds, Group III-V compounds, Group IV-VI compounds, Group IV compounds, and mixtures thereof.

The Group II-VI compounds are selected from the group consisting of, but not necessarily limited to: binary compounds, e.g., CdS, CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V compounds are selected from the group consisting of, but not necessarily limited to: binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI compounds are selected from the group consisting of, but not necessarily limited to: binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe. The Group IV compounds are selected from the group consisting of, but not necessarily limited to: unary compounds, e.g., Si and Ge; and binary compounds, e.g., SiC and SiGe.

The semiconductor nanocrystals 3, 23 may further include an overcoating to form a core-shell structure. The semiconductor nanocrystals 3, 23 may have a multilayer structure including a core and at least one layer.

The overcoating or the constituent layer of the multilayer may be formed of a material selected from Group II-VI compounds, Group III-V compounds, Group IV-VI compounds, Group IV compounds and mixtures thereof.

The Group II-VI compounds are selected from the group consisting of: binary compounds, e.g., CdS, CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V compounds are selected from the group consisting of: binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI compounds are selected from the group consisting of: binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe. The Group IV compounds are selected from the group consisting of: unary compounds, e.g., Si and Ge; and binary compounds, e.g., SiC and SiGe.

The light conversion layer 4, 24, 34 may be formed of nanocrystal-metal oxide composites.

The metal oxide can be selected from the group consisting of $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, CeO, $CrO_3$ and mixtures thereof.

The light conversion layer 4, 24, 34 may be composed of a transparent substrate and nanocrystals coated on the substrate.

The light conversion layer 24 or 34 may be composed of a transparent substrate 27 or 37 and a nanocrystal-polymer or nanocrystal-metal oxide composite film 28 or 38, respectively, formed on the substrate.

The transparent substrate 27 or 37 may be of any type so long as light emitted from the excitation source can pass therethrough. Examples of suitable materials for the transparent substrate include glass, quartz and polymers.

Polymeric materials that can be mixed with the nanocrystals to form the light conversion layer are transparent materials which do not absorb light emitted from the excitation source, and examples thereof include styrene, acrylate, carbonate, ethylene, siloxane and epoxy polymers.

Suitable metal oxides which can be mixed with the nanocrystals to form the light conversion layer are transparent materials which do not absorb light emitted from the excitation source, and examples thereof include $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, CeO and $CrO_3$.

The thickness of the light conversion layer 4, 24, 34 may be about 50 micrometers (μm) to about 1,000 μm where about 10% to about 100% of the emission wavelengths of the excitation source can be converted, but is not particularly limited to this range.

The concentration of the nanocrystals in the light conversion layer may be about 0.01% to about 20% by weight where about 10% to about 100% of the emission wavelengths of the excitation source can be converted, but is not particularly limited to this range.

The light conversion layer 4, 24, 34 may include one or more layers whose emission wavelength ranges are different from those of the excitation source 2, 22, 32, wherein the constituent layers emit light in different wavelength ranges.

The constituent layers of the light conversion layer 4, 24, 34 may be arranged in such a manner that their emission wavelength ranges increase or decrease with increasing distance from the excitation source 2, 22, 32.

The emission wavelengths of the light conversion layer are determined according to those of the nanocrystals. The light conversion layer may have an emission wavelength range of about 490 nm to about 750 nm where it can absorb and emit light emitted from the excitation source, but is not especially limited to this range.

The light conversion layer may be composed of a red emitting nanocrystal layer and a green emitting nanocrystal layer formed thereon so as to emit white light in combination with light emitted from the excitation source. Alternatively, the light conversion layer may be composed of a green emitting nanocrystal layer and a red emitting nanocrystal layer formed thereon so as to emit white light in combination with light emitted from the excitation source.

The nanocrystal light-emitting diode of exemplary embodiments of the present invention is applicable to white light-emitting diodes and other diodes emitting light in the visible region.

Hereinafter, exemplary embodiments of the present invention will be described in further detail with reference to Examples. These Examples are set forth to illustrate exemplary embodiments, but should not be construed as being limited these exemplary embodiments.

EXAMPLES

Preparative Example 1

Synthesis of CdSe/CdS/ZnS Nanocrystals 200 mL of trioctylamine ("TOA"), 5.4 g of oleic acid and 0.618 g of cadmium oxide were simultaneously put into a round-bottom flask equipped with a reflex condenser. The mixture was allowed to react with stirring while maintaining the reaction temperature at 300° C. to obtain a reaction mixture.

Separately, a selenium (Se) powder was dissolved in trioctylphosphine ("TOP") to obtain a Se-TOP complex solution (Se concentration: ca. 0.2 M). 6 mL of the Se-TOP complex solution was rapidly fed to the reaction mixture and the reaction was allowed to proceed for 1.5 minutes.

To the reaction mixture was slowly added dropwise a mixture of 2.4 mmol of octanethiol and 2 mL of TOA. The resulting mixture was allowed to react for 30 minutes.

Immediately after a solution of 16 mmol of zinc acetate in 4 mL of TOA was slowly added dropwise to the reaction mixture, a mixture of 20 mmol of octanethiol and 4 mL of TOA was slowly added dropwise thereto. The reaction proceeded for 60 minutes.

After the reaction was finished, the reaction mixture was cooled to room temperature as rapidly as possible. Ethanol as a non-solvent was added to the reaction mixture, followed by centrifugation. The precipitate was separated from the supernatant and dispersed in toluene to prepare a solution of CdSe/CdS/ZnS nanocrystals (3 g). The nanocrystals were found to emit light at a wavelength of 602 nm. The luminescence efficiency of the nanocrystals was 76% with respect to that of Rhodamine 6G.

Example 1

Fabrication of Nanocrystal LED in which Space Between Excitation Source and Light Conversion Layer is Exposed to the Outside 10 μl of a solution of the CdSe/CdS/ZnS nanocrystals prepared in Preparative Example 1 and 990 μl of toluene were placed in a quartz cuvette and measured for absorbance using a UV-Vis spectrometer. The solution was measured to have an optical density of 0.01 at a first absorption maximum. 1 ml of the solution was sampled, homogeneously mixed with 1 ml of a solution containing an epoxy resin (SJ4500 A and B resins, available from Samchun Pure Chemical, Korea) as a main material and a hardener, and allowed to stand under vacuum for one hour to completely remove the remaining toluene in the nanocrystals. As a result, a solution of nanocrystal-epoxy composites was prepared.

A package emitting 445-nm blue light was used as an LED excitation source. 5 μl of an epoxy resin (SJ4500) was applied to the upper edges of the package and a polyester ("PET") film having a size of 4.5 mm (width)×4.5 mm (length) was fixed thereto. The resulting structure was stored in an oven at 80° C. for about one hour to harden the epoxy resin, and then cooled to room temperature. 15 μl of the nanocrystal-epoxy composite solution was uniformly coated on the PET film. The coated structure was stored in the oven under a nitrogen atmosphere at 120° C. for 2 hours to harden the nanocrystal-epoxy composites, completing the fabrication of a nanocrystal light-emitting diode.

Figure 4:
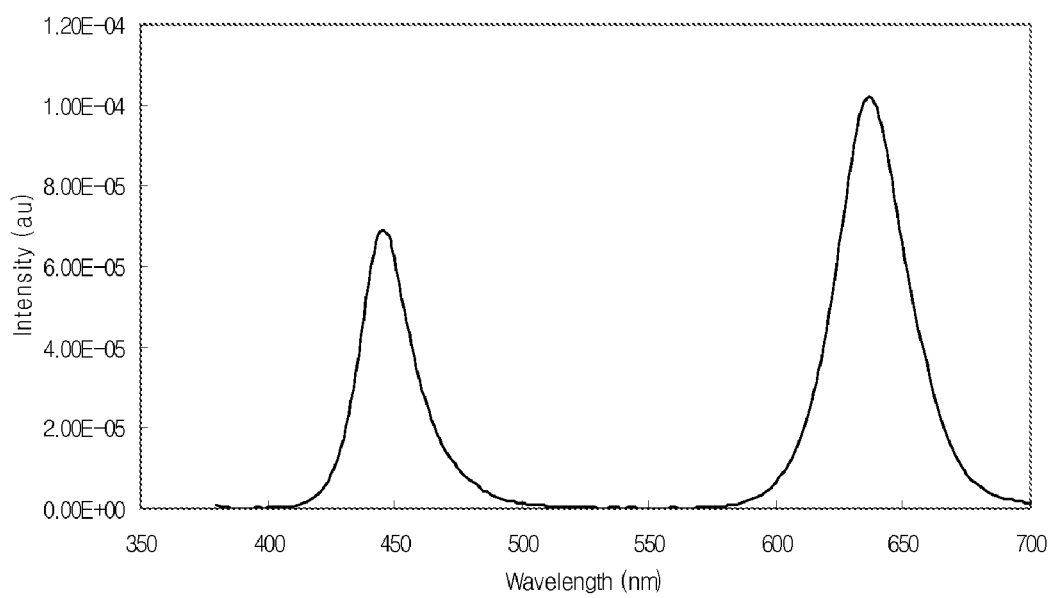

After electric wires were connected to respective electrodes of the LED, the wavelengths of the nanocrystal light-emitting diode were measured using a compact array spectrometer (CAS140) equipped with an integrating sphere. The results are shown in FIG. 4. The light conversion efficiency of the nanocrystal light-emitting diode was determined in comparison with the emission intensity in the blue spectral region of an LED where the nanocrystals were not applied. Specifically, assuming that the emission intensity in the blue spectral region was decreased due to the absorption of the nanocrystals, the light conversion efficiency of the nanocrystal light-emitting diode was determined by calculating the ratio of the spectral emission intensity of the nanocrystal light-emitting diode observed at 630 nm to that of the LED containing no nanocrystals observed at 630 nm. As a result, it was confirmed that about 20% of the blue energy absorbed was converted to red light of 630 nm.

While exemplary embodiments of the present invention have been described in detail above, the embodiments are simply for the purposes of illustration. It will be understood by those skilled in the art that various modifications and their equivalents can be made in alternative exemplary embodiments without departing from the spirit and scope of exemplary embodiments of the present invention. Thus, the genuine scope of the technical protection of example embodiments should be defined by the technical spirit of the claims which follow.

What is claimed is:

1. A nanocrystal light-emitting diode comprising:
   an excitation source;
   a nanocrystal-containing light conversion layer;
   an air layer disposed between the excitation source and the light conversion layer; and
   a support under the light conversion layer so that a gap between the excitation source and the light conversion layer is 0.05 mm or more,
   wherein the air layer is exposed to an outside of the nanocrystal light-emitting diode so that air can freely flow therethrough, and
   wherein the light conversion layer is directly on the support.

2. The diode according to claim 1, wherein the nanocrystals constituting the light conversion layer are semiconductor nanocrystals selected from the group consisting of Group II-VI compounds, Group III-V compounds, Group IV-VI compounds, Group IV compounds, and mixtures thereof.

3. The diode according to claim 1, wherein the light conversion layer is formed of nanocrystal-metal oxide composites.

4. The diode according to claim 3, wherein the metal oxide is selected from the group consisting of $TiO_2$, $ZnO$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, $CeO$, $CrO_3$ and mixtures thereof.

5. The diode according to claim 1, wherein the light conversion layer is composed of a transparent substrate and nanocrystals coated on the substrate.

6. The diode according to claim 1, wherein the light conversion layer is composed of a transparent substrate and a nanocrystal-metal oxide composite film formed on the substrate.

7. The diode according to claim 6, wherein the metal oxide is selected from the group consisting of $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, CeO, $CrO_3$ and mixtures thereof.

8. The diode according to claim 1, wherein the light conversion layer is composed of a transparent substrate and a nanocrystal-polymer composite film formed on the substrate.

9. The diode according to claim 8, wherein the polymer is selected from the group consisting of styrene polymers, acrylate polymers, carbonate polymers, ethylene polymers, siloxane polymers, epoxy polymers, and mixtures thereof.

10. The diode according to claim 1, wherein the light conversion layer has an emission wavelength range of 490 to 750 nm.

11. The diode according to claim 1, wherein the light conversion layer includes at least one layer having a peak emission wavelength different from a peak emission wavelength of the excitation source.

12. The diode according to claim 1, wherein the excitation source is a light-emitting diode (LED).

13. The diode according to claim 1, wherein the excitation source has an emission wavelength of about 340 nm to about 480 nm.

14. The diode according to claim 1, wherein a material having a refractive index between the refractive indices of the excitation source and air is applied to the excitation source to cover the excitation source.

15. The diode according to claim 1, wherein the light conversion layer includes a plurality of layers, each layer of the plurality of layers having a peak emission wavelength different from all other layers of the plurality of layers and different than a peak emission wavelength of the excitation source.

16. The diode according to claim 15, wherein the plurality of layers of the light conversion layer are arranged in such a manner that their peak emission wavelengths increase with increasing distance from the excitation source.

17. The diode according to claim 15, wherein the plurality of layers of the light constituent layers are arranged in such a manner that their peak emission wavelengths decrease with increasing distance from the excitation source.

18. The diode according to claim 1, wherein the support comprises a curable material.

19. The diode according to claim 1, wherein the support is interposed between and contacts a structure of the nanocrystal light-emitting diode and the nanocrystal-containing light conversion layer.

20. The nanocrystal light-emitting diode of claim 1, wherein the nanocrystal-containing light conversion layer is substantially rectilinear.

21. A nanocrystal light-emitting diode comprising:
an excitation source;
a nanocrystal-containing light conversion layer;
an air layer disposed between the excitation source and the light conversion layer; and
a support under the light conversion layer so that a gap between the excitation source and the light conversion layer is 0.05 mm or more, wherein the air layer is exposed to an outside of the nanocrystal light-emitting diode so that air can freely flow therethrough, and
where the light conversion layer comprise a polyester transparent substrate and a nanocrystal-epoxy composite film on the substrate and
the nanocrystal-epoxy composite film is on a surface of the substrate facing away from the excitation source.

* * * * *